United States Patent
Fujikawa et al.

(10) Patent No.: US 7,364,978 B2
(45) Date of Patent: Apr. 29, 2008

(54) METHOD OF FABRICATING SEMICONDUCTOR DEVICE

(75) Inventors: Kazuhiro Fujikawa, Osaka (JP); Shin Harada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 60 days.

(21) Appl. No.: 10/528,440

(22) PCT Filed: Apr. 20, 2004

(86) PCT No.: PCT/JP2004/005649

§ 371 (c)(1),
(2), (4) Date: Mar. 18, 2005

(87) PCT Pub. No.: WO2004/097914

PCT Pub. Date: Nov. 11, 2004

(65) Prior Publication Data

US 2006/0063342 A1    Mar. 23, 2006

(30) Foreign Application Priority Data

Apr. 25, 2003   (JP) ............................. 2003-122240

(51) Int. Cl.
*H01L 21/331* (2006.01)
(52) U.S. Cl. ............................. 438/369
(58) Field of Classification Search ............ 438/369
See application file for complete search history.

(56) References Cited

U.S. PATENT DOCUMENTS

| | | | | |
|---|---|---|---|---|
| 5,628,871 A * | 5/1997 | Shinagawa | ............... | 438/514 |
| 6,294,444 B1 * | 9/2001 | Ueno | ............... | 438/514 |
| 6,458,683 B1 * | 10/2002 | Lee | ............... | 438/613 |
| 6,670,688 B2 * | 12/2003 | Satoh et al. | ............... | 257/484 |
| 6,700,631 B1 * | 3/2004 | Inoue et al. | ............... | 349/45 |
| 6,803,243 B2 * | 10/2004 | Slater et al. | ............... | 438/20 |
| 2001/0046757 A1 * | 11/2001 | Takahashi et al. | ........ | 438/518 |
| 2002/0179910 A1 * | 12/2002 | Slater, Jr. | ............... | 257/77 |
| 2003/0040136 A1 * | 2/2003 | Eriksen et al. | ............ | 438/50 |
| 2003/0190820 A1 * | 10/2003 | Hill et al. | ............... | 438/785 |
| 2003/0194573 A1 * | 10/2003 | Itoh et al. | ............... | 428/461 |

FOREIGN PATENT DOCUMENTS

| | | |
|---|---|---|
| JP | 56-013722 | 2/1981 |
| JP | 61-069174 | 4/1986 |
| JP | 04-002120 | 1/1992 |
| JP | 10-256173 | 9/1998 |
| JP | 2001-332508 | 11/2001 |

OTHER PUBLICATIONS

Power Device, Power IC Handbook, edited by the Institute of Electrical Engineers of Japan, High Performance and High Function Power Device and Power IC Investigation and Research Committee, Corona Publishing Co., Ltd., Jul. 1996, pp. 38-41 (with partial English translation).

* cited by examiner

Primary Examiner—Thao P. Le
(74) Attorney, Agent, or Firm—W. F. Fasse; W. G. Fasse

(57) ABSTRACT

There is provided a method of fabricating semiconductor devices that allows ion implantation to be performed at high temperature with ions accelerated with high energy to help to introduce dopant in a semiconductor substrate, in particular a SiC semiconductor substrate, at a selected region to sufficient depth. To achieve this the method includes the steps of: providing the semiconductor substrate at a surface thereof with a mask layer including a polyimide resin film, or a $SiO_2$ film and a thin metal film; and introducing dopant ions.

15 Claims, 3 Drawing Sheets

METHOD OF FABRICATING SEMICONDUCTOR DEVICE

CROSS-REFERENCE TO RELATED APPLICATION

This application is a 371 of PCT/JP04/05649 filed on Apr. 20, 2004, which claims benefit of Japan application 2003-122240 filed on Apr. 25, 2003, the contents of which are hereby incorporated herein by reference in their entirety.

TECHNICAL FIELD

The present invention relates generally to methods employing ion implantation to provide a semiconductor substrate at a surface thereof with a doped region to produce a semiconductor device, and particularly to such methods that include providing a SiC semiconductor substrate at a surface thereof with a mask used for ion implantation, and then introducing dopant ions.

BACKGROUND ART

Silicon carbide (SiC) provides a wide bandgap, and a maximum insulating electric field larger than silicon (Si) by approximately one digit. Furthermore, SiC is comparable to Si in carrier mobility and comparable to GaAs in electron saturation drift rate, and also large in dielectric strength. As such, SiC is a material expected to be applied to rapid switching devices or devices for large power and similar, next-generation semiconductor device for electric power (in particular, junction field effect transistor (JFET), and the like).

SiC's crystal structure includes hexagonal close packed structure and cubic close packed structure, and the former structure further includes a large number of structures different in layer repetition cycle and more than 100 types of poly-type are known. Representative poly-types are for example 3C, 4H, 6H and the like. "C" represents cubic crystal and "H" represents hexagonal crystal, and a preceding numeral represents a repetition cycle. For cubic system, 3C is the only one, and it is referred to as β-SiC while the others are generally referred to as α-SiC.

Recently, Schottky diode, vertical MOSFET, JFET, thyristor and the like, or CMOS-IC, the most general-purpose semiconductor device, are prototyped as devices for electric power and their characteristics suggest that they have a potential to implement significantly satisfactory characteristics as compared with conventional Si semiconductor devices.

While SiC-vertical MOS semiconductor device, SiC-JFET device and the like are expected to implement significantly excellent characteristics, in reality, however, there is only a small number of reports that such devices have achieved satisfactory characteristics and the devices are not positively fabricated. This is because it is difficult to control microfabrication in a step such as implanting ions into a SiC semiconductor substrate.

When a Si-based semiconductor substrate is used to fabricate a semiconductor device, p dopant and n dopant are selectively introduced through a single mask and are thermally diffused to implement precise channel density. More specifically, JFET and similar semiconductor devices have characteristics depending on the channel's dimensions, which can significantly precisely be controlled, and increased yield of JFET or similar semiconductor devices can be achieved.

In contrast, if a SiC semiconductor substrate is used to fabricate a semiconductor device, the substrate hardly allows dopant diffusion, as compared with a Si-based semiconductor substrate, and it is difficult to precisely control channel density and the like, as can be done for example in a semiconductor device employing a Si-based semiconductor substrate. The device tends to increase for example in channel resistance, with significantly large variation. As such, such characteristics of SiC semiconductor device as expected are at present insufficiently achieved.

Furthermore, if a SiC semiconductor substrate is used to fabricate a semiconductor device and ions are implanted to introduce dopant, the dopant activates at poor rate. To increase the rate, the ions may be implanted at a high temperature of 300° C. or higher. This, however, prevents a resist film from being suitably used as a mask layer for ion implantation. Furthermore, if silicon oxide film, polysilicon film or the like is used as a mask layer, and exposed to high temperature, the mask layer tends to crack, peel off and the like disadvantageously.

As described above when a SiC semiconductor substrate is used to fabricate a semiconductor device (also referred in the present specification as a "SiC device") it is necessary to implant ions in an environment of high temperature to reduce damage to crystal.

Accordingly there is a demand for a material developed to be usable as a mask layer used in implanting ions in an environment of high temperature, and techniques are being developed in associated fields. It should be noted that a mask layer containing $SiO_2$ as material has a property that can ensure high energy implantation in an environment of high temperature. Such a property is utilized and $SiO_2$ film is used as a mask layer for ion implantation and subsequently thermal diffusion is performed to form a sufficiently deep doped region, as disclosed in Japanese Patent Laying-Open No. 10-256173 and *Power Device, Power IC Handbook*, edited by the Institute of Electrical Engineers of Japan, High Performance and High Function Power Device and Power IC Investigation and Research Committee, Corona Publishing Co., Ltd., July 1996, pp. 38-41.

For example, a silicon substrate is subjected to CVD to have the entire surface with $SiO_2$ film thereon and subsequently photolithography is employed to form a mask pattern. In the photolithography, the $SiO_2$ film has an entire surface provided with photoresist and exposed to light only at a portion to be provided with a hole. The photoresist is thus exposed, and the exposed portion is removed by development. Then on the remaining photoresist the underlying $SiO_2$ film is dry etched and thus opened and thereafter the photoresist is removed to obtain a mask pattern of $SiO_2$.

Subsequently, B or similar dopant ions are implanted in approximately $1 \times 10^{14}$ $cm^{-2}$. As the $SiO_2$ film serves as a mask, the dopant ions are implanted only in the film's opening. In the ion implantation, ions of dopant obtained by discharging $AsH_3$, $PH_3$, $BF_2$ or similar gas are accelerated to several tens to several hundreds keV and thus implanted into a substrate. Subsequently, thermal diffusion is performed to push in the dopant and thereafter the $SiO_2$ film is dissolved with hydrofluoric acid and thus removed. Subsequently in a semiconductor device fabrication process such thin-film deposition, photolithography, etching, and ion implantation are repeatedly performed.

If a SiC device is fabricated, however, a SiC semiconductor substrate does not allow sufficient thermal diffusion of dopant. Accordingly, to achieve sufficiently deep dopant implantation, high energy needs to be applied to implant ions, and if the mask layer of $SiO_2$ exceeds 1 μm in thickness, it is prone to cracking and not suitably used as a mask layer for ion implantation.

By contrast, an oxide film containing $SiO_2$ that has a thickness of 1 μm or smaller can prevent small energy applied to implant ions. As such, the ions cannot be accelerated with high energy and are thus implanted to a depth of 0.3 μm at most. As such in general a depth of implantation of 0.6 to 1 μm required for a semiconductor device can hardly be achieved and $SiO_2$ cannot suitably be used as a mask for a SiC semiconductor substrate.

Furthermore, if $SiO_2$ is used as material for a mask, a series of complicated steps is required including employing CVD to deposit $SiO_2$ film, photolithography with resist used, dry etching to provide the $SiO_2$ film with an opening, implanting ions, and removing the $SiO_2$ film. Furthermore, CVD and dry etching require that the semiconductor substrate be introduced in a vacuumed reactor, resulting in poor fabrication efficiency.

Thus employing a mask layer of $SiO_2$ is accompanied by a disadvantageously limited depth of ion implantation. As such it is not positively used in fabricating semiconductor devices employing a SiC semiconductor substrate. Should it be used, a complicated process is still required to overcome the issues as described above.

DISCLOSURE OF THE INVENTION

The present invention contemplates a method of fabricating semiconductor devices that allows ion implantation at high temperature with ions accelerated with high energy to help to introduce dopant in a semiconductor substrate, a SiC semiconductor substrate in particular, at a selected region to sufficient depth.

To achieve the above object the present method employs ion implantation to provide a semiconductor substrate at a surface thereof with a region having dopant introduced therein, and includes the steps of: providing the semiconductor substrate at a surface thereof with a mask layer including a polyimide resin film; and implanting dopant ions.

Furthermore the present method in another aspect employs ion implantation to provide a semiconductor substrate at a surface thereof with a region having dopant introduced therein, and includes the steps of: providing the semiconductor substrate at a surface thereof with a mask layer including a $SiO_2$ film and a thin metal film; and implanting dopant ions.

The semiconductor substrate can be a SiC semiconductor substrate. The semiconductor substrate at a region provided with the mask layer can be prevented from introduction of dopant ions so that the dopant ions can be introduced into a region unmasked by the mask layer.

If the mask layer including the polyimide resin film is deposited, the semiconductor substrate is heated preferably to 300° C. or higher, more preferably 500° C. or higher, and dopant ions are thus implanted. The polyimide resin film is suitably formed of photosensitive polyimide resin film and preferably has a thickness of at least twice the depth of dopant introduced into the semiconductor substrate at a region free of the polyimide resin film. Preferably the polyimide resin film and the semiconductor substrate sandwich a thin film of metal or $SiO_2$.

In contrast, if the mask layer including the $SiO_2$ film and the thin metal film is deposited, the semiconductor substrate is heated preferably to 300° C. to 500° C., more preferably 500° C. to 800° C., and dopant ions are introduced. Suitably the mask layer is formed of three or more layers, and the $SiO_2$ resin film and the thin metal film each preferably have an average thickness of 500 nm to 1.5 μm. The mask layer preferably has the $SiO_2$ film or the thin metal film as a layer corresponding to a bottommost layer or that corresponding to a topmost layer. Such $SiO_2$ film can preferably be formed by SOG.

BEST MODE FOR CARRYING OUT THE INVENTION

Method Employing Polyimide Resin Film as Mask to Fabricate Semiconductor Device

The present method is characterized by including the step of providing a semiconductor substrate at a surface thereof with a mask layer including polyimide resin film, and subsequently implanting dopant ions. The semiconductor substrate is provided with the polyimide resin film, which can be used as a mask for the semiconductor substrate to allow ions to be implanted at high temperature with high energy to introduce dopant so that a SiC semiconductor substrate can also have dopant introduced to sufficient depth.

The present invention employs a semiconductor substrate which is preferably, among other conventionally known semiconductor substrates, a SiC semiconductor substrate, since silicon carbide (SiC) provides a wide bandgap, and a maximum insulating electric field larger than silicon (Si) by approximately one digit, and is comparable to Si in carrier mobility and comparable to GaAs in electron saturation drift rate, and also large in dielectric strength.

Furthermore, it is also because the present invention employs a mask layer, as will be described hereinafter, that exhibits an excellent property allowing high energy implantation in an environment of high temperature and hence sufficiently deep dopant implantation into a SiC semiconductor substrate and other semiconductor substrates allowing small thermal diffusion of dopant.

In the present specification a SiC semiconductor substrate refers to a semiconductor substrate containing SiC as material. Herein, the SiC semiconductor substrate is not required to contain SiC alone as material and may contain other components as material within a range that does not impair SiC's excellent property.

The present invention employs SiC having a crystal structure which is not particularly limited, and may employ SiC for example having hexagonal close packed structure or cubic close packed structure. Furthermore, SiC's hexagonal close packed structure further includes a large number of structures different in layer repetition cycle and more than 100 types of poly-type are known, and any type of structure may be used. For example, as representative poly-types, 3C, 4H, 6H and the like can be used. In the present specification, "C" represents cubic crystal and "H" represents hexagonal crystal, and a preceding numeral represents a repetition cycle. Of these, for cubic system, 3C is the only one, and it is referred to as β-SiC while the others are generally referred to as α-SiC.

It should be noted, however, that the semiconductor substrate employed in the present invention is not limited to a SiC semiconductor substrate and may be any conventionally known semiconductor substrate, since the present invention employs a mask layer that allows dopant implantation at high temperature by ions of high energy and hence sufficiently deep dopant implantation if a semiconductor substrate other than a SiC semiconductor substrate is used.

Figure 1A:
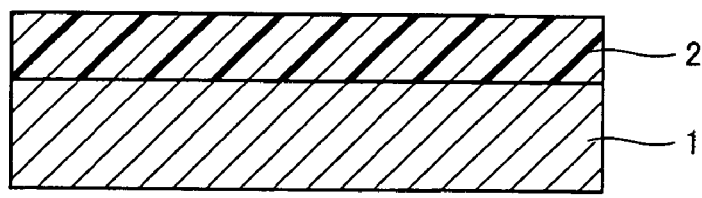
FIGS. 1A-1E show a process representing the present method of fabricating semiconductor devices.
Figure 1B:
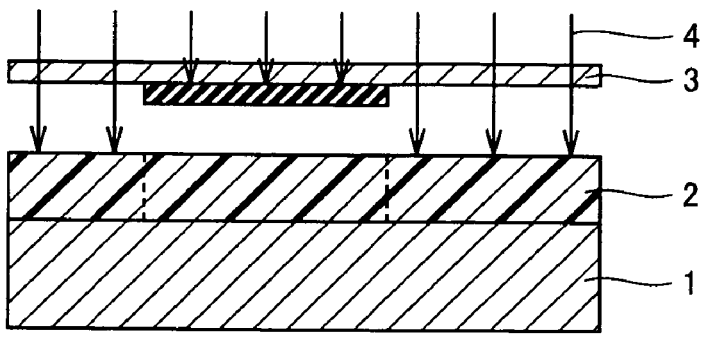
Figure 1C:
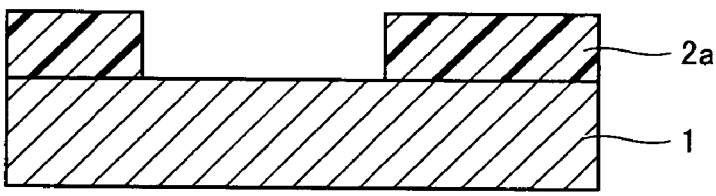

As a typical example of the present method a method employing photosensitive polyimide resin film and implanting ions into a SiC semiconductor substrate will be shown in FIGS. 1A-1E. Initially as shown in FIG. 1A a SiC semiconductor substrate 1 is provided thereon with a photosensitive polyimide resin film 2. Subsequently, as shown in FIG. 1B, a mask 3 having a prescribed pattern is introduced and therethrough the intermediate product is exposed to light 4 and then developed and fired. Thus, as shown in FIG. 1C, on the SiC semiconductor substrate a polyimide resin film 2a having the prescribed pattern can be readily provided.

Figure 1D:
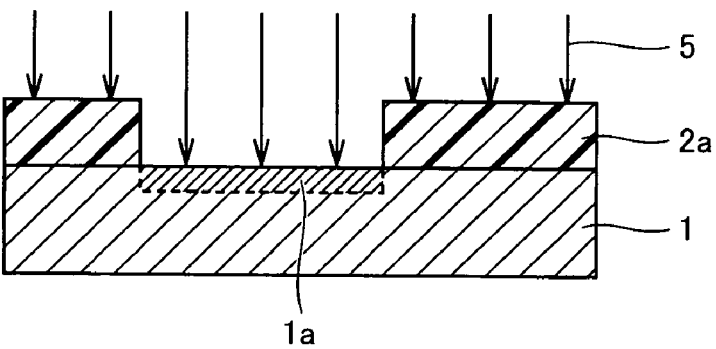
Figure 1E:
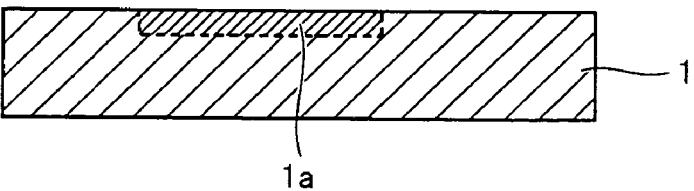

Subsequently, as shown in FIG. 1D, through a mask layer including polyimide resin film, ions 5 are implanted into SiC semiconductor substrate 1 to provide a doped region 1a. Finally, the polyimide resin film is removed to obtain SiC semiconductor substrate 1 having a doped region 1a, as shown in FIG. 1E. Thus a prescribed mask can prevent implantation of dopant ions into a masked region and allows implantation of the dopant ions only at an unmasked region.

Dopant ions are preferably implanted with the SiC semiconductor substrate heated to 300° C. or higher, preferably 500° C. or higher, to prevent the SiC semiconductor substrate's crystal structure from being amorphous. Furthermore, the substrate's temperature is preferably 1000° C. or lower, more preferably 800° C. or lower, to prevent SiC from sublimation.

Polyimide is a condensation polymer composed of bifunctional carboxylic anhydride and primary diamine and having an imide structure (—CO—NR—CO) at a main chain of a polymer skeleton. Of polyimides, aromatic heterocyclic polyimide is preferable as it has an excellent physical property and has significant stability against heat and oxidation. Furthermore, of aromatic heterocyclic polyimides, a polyimide derived from aromatic diamine and aromatic dianhydride is more preferable as it is stable against heat.

Furthermore, the polyimide resin film is preferably formed of photosensitive polyimide resin as it can help to form a mask having a prescribed pattern or a SiC semiconductor substrate. Photosensitive polyimide resin film can be deposited simply by applying it on the SiC semiconductor substrate. It can thus eliminate the necessity of performing a complicated process including photolithography employing photoresist, as employed when $SiO_2$ is used as material for a mask, and facilitate implantation of ions into the SiC semiconductor substrate at a region selectively. Furthermore, CVD, dry etching and the like can be dispensed with and high fabrication efficiency can be achieved.

Figure 2:
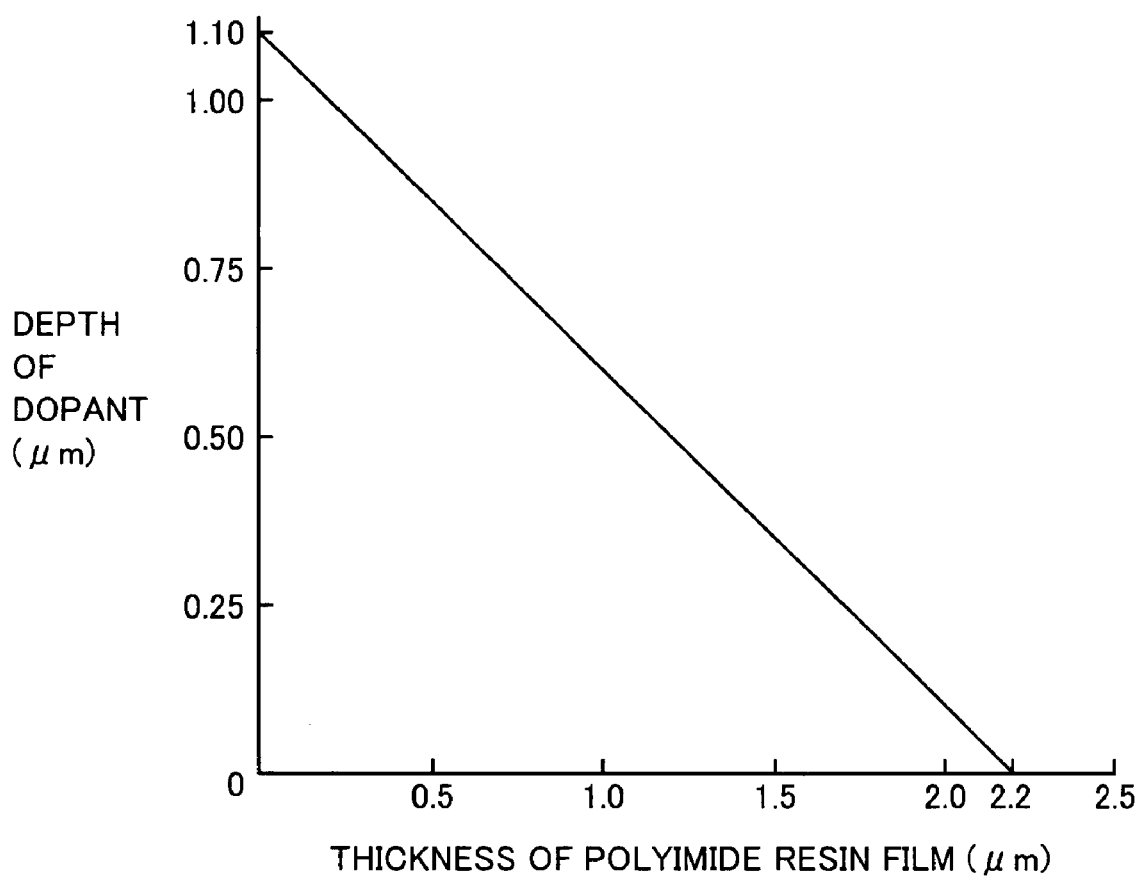
FIG. 2 represents a relationship between a polyimide resin film's thickness and implanted dopant (Al)'s depth.

The SiC semiconductor substrate is provided thereon with a polyimide resin film preferably having a thickness twice or more the depth of dopant introduced into the SiC semiconductor substrate at a region that is not provided with the polyimide resin film. FIG. 2 represents a relationship between a polyimide resin film's thickness and implanted dopant (Al)'s depth, as provided when Al ions are implanted into a 4H-SiC semiconductor substrate with acceleration energy of 340 keV in a dosage of $1.0 \times 10^{15}$ $cm^{-2}$.

As is apparent from the FIG. 2 result, a region without the polyimide resin film has the dopant introduced to a depth of 1.1 μm. In contrast, a region with a polyimide resin film having a thickness of 2.2 μm has the dopant introduced to a depth of 0.0 μm, or completely interrupts the Al ions. Considering the energy of ions to be implanted, and accordingly forming a polyimide resin film to have a thickness of at least twice the depth of a region to be doped, can completely interrupt ions to ensure that ions are implanted only at a selected region.

Polyimide resin film is significantly adhesive and has high chemical resistance, and to help to remove the polyimide resin film after ion implantation, a thin metal or $SiO_2$ film 36 is preferably introduced between polyimide resin film 32 and SiC semiconductor substrate 31. The thin film that is formed of Al or similar metal or $SiO_2$ has a thickness preferably of 0.02 μm or larger, more preferably 0.05 μm or larger as the thin film can be wet etched to help to remove the polyimide resin film. On the other hand, such a thin film preferably has a thickness of 0.5 μm or smaller, preferably 0.2 μm or smaller as it can be readily etched away and side-etching can also be reduced. Accordingly, such a thin film preferably has a thickness of approximately 0.1 μm.

Preferably the thin film formed for example of $SiO_2$ is provided on the SiC semiconductor substrate before the polyimide resin film is provided, and after the polyimide resin film is exposed, developed and fired the thin film that is located in an opening of the polyimide resin film is wet etched away. Ion implantation is not prevented by the thin film and can proceed smoothly.

Method Employing $SiO_2$ film and Thin Metal Film as Mask to Fabricate Semiconductor Device Another present method includes the steps of providing a semiconductor substrate at a surface thereof with a mask layer including a $SiO_2$ film and a thin metal film; and implanting dopant ions in a surface of the semiconductor substrate. Such a mask also hardly cracks in a $SiO_2$ containing mask layer for a thickness capable of preventing implantation of ions with high energy, and such a mask layer can be used to also allow implantation of ions at high temperature with high energy and hence sufficiently deep dopant implantation into a SiC semiconductor substrate and other semiconductor substrates allowing small thermal diffusion of dopant.

Figure 4A:
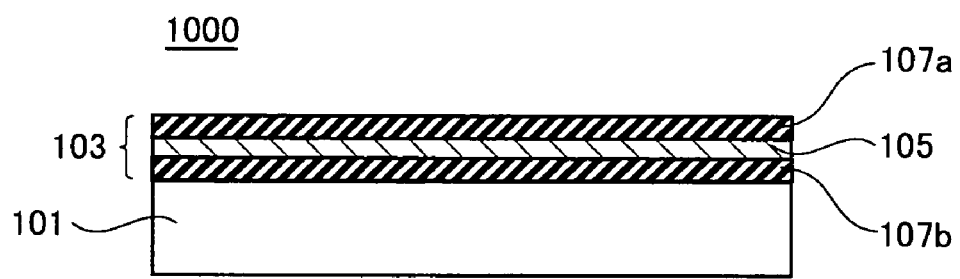
FIGS. 4A-4E show a process representing the present method of fabricating semiconductor devices.

FIGS. 4A-4E show a process illustrating the present method. Initially, a semiconductor substrate is provided on a surface thereof with a mask layer formed of a composite film including a $SiO_2$ film and a thin metal film. FIG. 4A shows the present method at the step of depositing a mask layer 103. In accordance with the present invention a semiconductor device 1000, as shown in FIG. 4A, has a semiconductor substrate 101, and on a surface thereof mask layer 103 is deposited. Semiconductor substrate 101 including SiC and other semiconductors is as has been described previously. Furthermore in the FIG. 4A example mask layer 103 is a composite film having structure formed of three layers including a $SiO_2$ film 107a, a thin metal film 105 and a $SiO_2$ film 107b.

Generally in fabricating a semiconductor device it is important that dopant be introduced only at a predetermined region selectively. One of means allowing selective dopant introduction is ion implantation through a mask layer. For semiconductor devices formed of SiC semiconductor or similar semiconductor allowing small thermal diffusion of dopant, in particular, ion implantation through a mask layer is almost the only practical means to selectively introduced dopant. By forming a prescribed mask a masked region can be prevented from dopant ion implantation and an unmasked region alone is allowed to have dopant ion implantation.

In the present method a mask layer deposited on a semiconductor substrate to select a region to have ions implanted therein can be provided in the form of a composite film of $SiO_2$ film and thin metal film as shown in FIG. 4A to allow region-selective ion implantation into a SiC semiconductor substrate and other semiconductor substrates allowing small thermal diffusion of dopant, while reducing damage to crystal structure.

The present invention's mask layer is a mask layer used in implanting dopant ions into a semiconductor substrate and includes a $SiO_2$ film and a thin metal film. The $SiO_2$ film may be any oxide film that contains $SiO_2$ as material, since such oxide film has an excellent property that can endure high energy implantation in an environment of high temperature. Furthermore, the $SiO_2$ film is not required to contain $SiO_2$ as the only material and may contain other components within a range that does not impair $SiO_2$'s excellent property.

The mask layer includes the $SiO_2$ film, which is not particularly limited and may be provided by conventionally known methods. For example, SOG can be employed to deposit the $SiO_2$ film. More specifically, silanol $[(OR)_m R_n Si (OH)_{4-m-n}]$ dissolved in alcohol or similar solvent is spin-applied on a wafer and then thermally set to obtain an insulation film close in composition to pure $SiO_2$ (also referred to in the present specification as SOG film). In the present specification the $SiO_2$ film includes SOG film. The SOG film includes inorganic and organic SOG films depending on the type of silanol compound. The SOG method, utilizing liquid to deposit film, is advantageous in that it can fill a narrow space between interconnects.

The present invention's mask layer includes the $SiO_2$ film having an average thickness preferably of 500 nm or larger, more preferably 800 nm or larger. Furthermore, an average thickness of 1.5 μm or smaller is preferable, and an average thickness of 1.2 μm or smaller is more preferable. If the $SiO_2$ film has an average thickness of less than 500 nm, the film can prevent only limited energy of ion implantation, providing a tendency that ions are implanted shallower. If the $SiO_2$ film has an average thickness exceeding 1.5 μm, the film is prone to cracking in an environment of high temperature.

The mask layer may include any thin metal film that contains metal as material, although metal vapor-deposited film is particularly preferable. The metal vapor-deposited film is readily obtained by vapor depositing a metal by a conventionally known method on a $SiO_2$ containing oxide film, a SiC semiconductor substrate or the like. The thin metal film deposited through metal vapor deposition is preferably provided for example through EB vapor deposition. By including the metal vapor deposited film and other thin metal film in the mask layer, the $SiO_2$ film does not have an average thickness exceeding 1.5 μm and the mask layer in its entirety can have an average thickness of 1.5 μm or larger. As such if the $SiO_2$ film is exposed to high temperature it hardly cracks and high energy ion implantation can be prevented.

The mask layer's thin metal film is not particularly limited and may be a thin film containing any conventionally known metal as material. For example, a thin film for example containing aluminum, nickel, gold or similar metal as material can be used. Of these metals, aluminum is particularly preferably contained as a material in the thin film as such a thin film can be provided readily and inexpensively. It is not a requirement that the thin metal film include metal as the only material. It may contain other components as material within a range that does not impair the thin metal film's excellent property.

The mask layer's thin metal film preferably has an average thickness of 500 nm or larger, more preferably 800 nm or larger. Furthermore, an average thickness of 1.5 μm or smaller is preferable, and an average thickness of 1.2 μm or smaller is more preferable. If the thin metal film has an average thickness less than 500 nm, then in an environment of high temperature the $SiO_2$ film is prone to cracking and high energy ion implantation tends to be difficult to achieve. If the thin metal film has an average thickness larger than 1.5 μm then side-etching tends to increase in patterning the mask.

The present invention's mask layer is a mask layer employed in implanting dopant ions into a semiconductor substrate, and it may have a structure formed of two or more layers that are implemented by $SiO_2$ film and thin metal film. The structure formed of three or more layers can prevent the $SiO_2$ film exposed to high temperature from being prone to cracking, and the mask layer having an increased total thickness can prevent high energy ion implantation.

The present invention's mask layer preferably includes $SiO_2$ film as a film corresponding to a bottommost layer. Such a structure can prevent metal ions originated from the thin metal film from contaminating SiC and other semiconductor substrates. Furthermore the mask layer preferably includes a thin metal film as a film corresponding to a bottommost layer. Such structure can help to remove the mask layer from the semiconductor substrate after ion implantation.

The present invention's mask layer preferably includes $SiO_2$ film as a film corresponding to a topmost layer. Such a structure can prevent the metal vapor deposited film and other thin metal films from being etched away for example by reactive ion etching (RIE) and can thus help to form a pattern. Furthermore, the mask layer preferably includes a thin metal film as a film corresponding to a topmost layer. Such structure can minimize effect of crack introduced in the $SiO_2$ film.

Among these structures, the present invention's mask layer particularly preferably has a structure including, as seen from the bottommost layer, a $SiO_2$ film, a thin metal film and a $SiO_2$ film sequentially. The mask layer having such a 3-layer structure does not have a $SiO_2$ film having an average thickness exceeding 1.5 μm, and the mask layer can have a total average thickness of 1.5 μm or larger. As such, the $SiO_2$ film hardly cracks even in an environment of high temperature and the mask layer in its entirety can prevent high energy ion implantation.

Figure 4B:
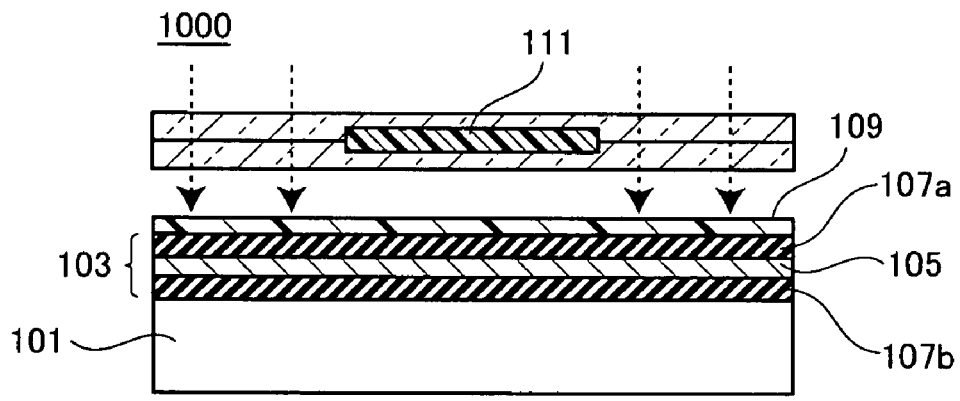

Then for example as shown in FIG. 4B semiconductor device 1000 provided with mask layer 103, as described with reference to FIG. 4A, has resist material applied on mask layer 107a and a glass mask 111 is then used for patterned exposure to set the resist material to provide a resist film 109. The resist material is not particularly limited and conventionally known resist material can be selected to meet the condition of interest. Furthermore, the glass mask is also not particularly limited and conventionally known glass mask can be used to provide patterned exposure.

Figure 4C:
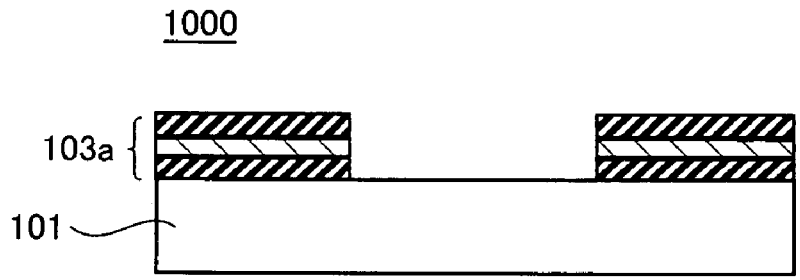

Subsequently for example as shown in FIG. 4C semiconductor device 1000 provided with resist film 109, as described with reference to FIG. 4B, is RIEed, wet etched or the like etching with resist film 109 used to form a patterned mask layer 103a. RIE or the like can be performed under conventionally known conditions. For example, parallel plate RIE apparatus, acidic solution, and the like can be employed.

Figure 4D:
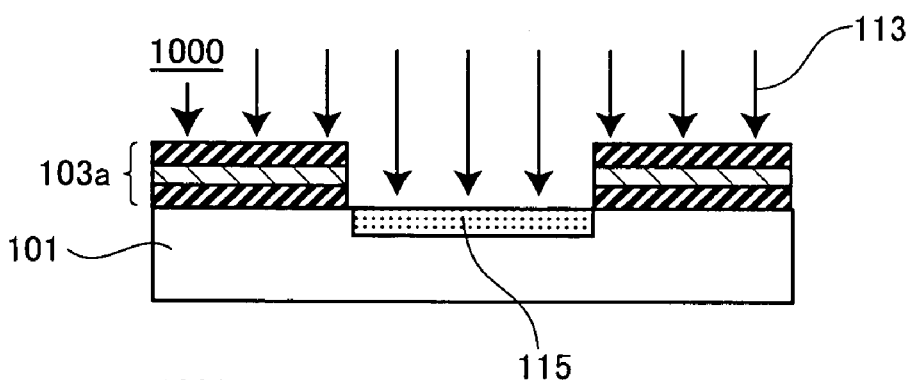

Subsequently as shown in FIG. 4D semiconductor substrate 1000 is subjected to ion implantation to introduce dopant into SiC semiconductor substrate 101. The present invention can employ any type of dopant, and it can be selected, as appropriate, depending on the structure and object of the semiconductor device fabricated. For example, aluminum, boron, nitrogen, phosphorus and the like can be selected. Furthermore, ions can be implanted under conventionally known conditions, although preferably by employing a high current ion implantation apparatus or the like.

In the present invention ions are preferably implanted in a dosage of $1 \times 10^{15}$ cm$^{-2}$ or less. For a dosage exceeding $1 \times 10^{15}$ cm$^{-2}$, implanted ions tend to collide with and thus push previously implanted ions deeper. Furthermore, for a dosage exceeding $1 \times 10^{17}$ cm$^{-2}$, SiC's crystal readily destroys and thus becomes amorphous.

In accordance with the present invention when ions are implanted into a substrate the substrate desirably has a temperature of 300° C. or higher, particularly desirably 500° C. or higher to reduce damage by ion implantation to a SiC semiconductor substrate's crystal structure. Furthermore, desirably the substrate has a temperature of 1000° C. or lower, 800° C. or lower in particular, to prevent sublimation of SiC. In accordance with the present invention ions are implanted at any angle applied in conventionally known ion implantation methods. Preferably, however, ions are implanted for example at an angle perpendicular to the substrate.

Figure 4E:
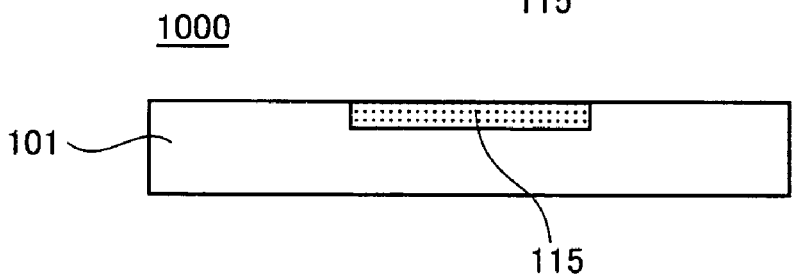

Subsequently, as shown in FIG. 4E, semiconductor device 1000 having dopant ion-implanted, as described with reference to FIG. 4D, has mask layer 103a removed therefrom. The mask layer may be removed by any conventionally known method therefor. Preferably, however, it is for example dissolved with acidic solution and thus removed.

In accordance with the present invention a semiconductor substrate is doped with ions implanted by a method including the steps of: providing the semiconductor substrate at a surface thereof with a mask layer including a SiO$_2$ film and a thin metal film; and implanting ions of dopant into the surface of the semiconductor substrate. The details of this method is similar to those of the present method of fabricating semiconductor devices.

FIRST EXAMPLE

Initially, as shown in FIG. 1A, a 4H-SiC semiconductor substrate 1 of 5 inches in diameter and 600 μm in thickness is spin-coated with negative photosensitive polyimide resin (HD4010 produced by Hitachi-Dupont Microsystems) and dried in the atmosphere to form a photosensitive polyimide resin film 2 having a thickness of 3.0 μm. Then, as shown in FIG. 1B, through mask 3 having a prescribed pattern, photosensitive polyimide resin film 2 is exposed to light 4 and then developed with a dedicated developer formed of organic solvent, and then fired to form a patterned polyimide resin film 2a on the SiC semiconductor substrate at a region to be undoped, as shown in FIG. 1C. The use of the photosensitive polyimide resin allows the mask to be formed more readily than photolithography.

Subsequently, SiC semiconductor substrate 1 and the polyimide resin film are heated to 500° C., and, as shown in FIG. 1D, through patterned polyimide resin film 2a Al ions 5 are implanted into SiC semiconductor substrate 1 to form a doped region 1a. The Al ions are implanted with acceleration energy of 340 keV and in a dosage of $1.0 \times 10^{15}$ cm$^{-2}$.

Finally, the polyimide resin film is removed with hydrofluoric acid to obtain SiC semiconductor substrate 1 having doped region 1a, as shown in FIG. 1E, having a depth of 1.1 μm. A doped region having a depth that cannot be achieved with conventional SiO$_2$ mask can thus be obtained.

SECOND EXAMPLE

Figure 3:
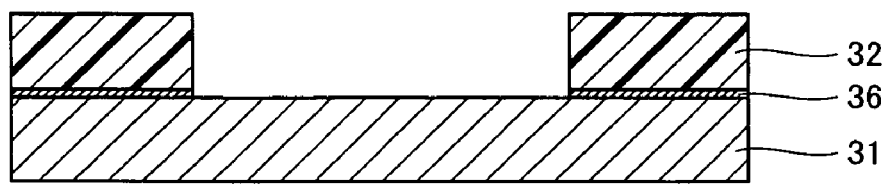
FIG. 3 is a cross section showing a polyimide resin film and a SiC semiconductor substrate with a thin film posed therebetween in a manner in accordance with the present invention.

As shown in FIG. 3, a SiC semiconductor substrate having a doped region is produced similarly as has been described in the first example except that a thin metal film 36 formed of Al and having a thickness of 0.1 μm is posed between a polyimide resin film 32 and SiC semiconductor substrate 31. After ion implantation the polyimide resin film provided on the SiC semiconductor substrate with the thin metal film of Al posed therebetween can be readily wet etched away from the SiC semiconductor substrate with phosphoric acid as the thin metal film of Al serves as a boundary. Increased production efficiency can thus be achieved.

The thin film of Al is provided on the SiC semiconductor substrate before the polyimide resin film is provided, and after the polyimide resin film is exposed, developed and fired the thin film that is located in an opening of the polyimide resin film is wet etched away. Ion implantation is thus not prevented.

THIRD EXAMPLE

A SiC semiconductor substrate having a doped region is produced similarly as has been described in the first example except that a thin film formed of SiO$_2$ and having a thickness of 0.1 μm is posed between a polyimide resin film and the SiC semiconductor substrate. After ion implantation, the polyimide resin film is wet-etched away with hydrofluoric acid. The polyimide resin film is readily removed, similarly as has been described in the second example, as the thin film of SiO$_2$ film serves as a boundary. Operation can be conducted efficiently.

The thin film of SiO$_2$ is provided on the SiC semiconductor substrate before the polyimide resin film is provided, and after the polyimide resin film is exposed, developed and fired the thin film formed of SiO$_2$ that is located in an opening of the polyimide resin film is wet etched away. Ion implantation is thus not prevented.

FOURTH EXAMPLE

Initially a 1 cm square 4H-SiC substrate is prepared (having a surface with an orientation inclined relative to a 0001 plane by approximately 8°). Then, as shown in FIG. 4A, SiC semiconductor substrate 101 has, as seen upwards, a SiO$_2$ film 107b (average thickness: 1 μm), a thin metal film of Al 105 (average thickness: 1 μm), and a SiO$_2$ film 107a (average thickness: 1 μm) deposited thereon sequentially to together form mask layer 103. Note that SiO$_2$ films 107a and 107b are deposited by SOG and thin metal film of Al 105 is provided through metal vapor deposition.

Then, as shown in FIG. 4B, SiO$_2$ film 107a has resist material applied thereon and glass mask 111 is then used for patterned exposure to set the resist material to provide resist film 109. Then SiC semiconductor substrate 101 with resist film 109 is RIEed with resist film 109 interposed to form patterned mask layer 103a (FIG. 4C). Then, as shown in FIG. 4D, through mask layer 103a into SiC semiconductor substrate 101 ion implantation is performed to introduce Al ions as dopant into SiC semiconductor substrate 101.

In the ion implantation, the SiC semiconductor substrate and the mask layer are previously heated to 500° C. and the Al ions are implanted with acceleration energy 340 keV and in a dosage of $1 \times 10^{15}$ cm$^{-2}$. Finally, SiC semiconductor substrate 101 having dopant ions implanted therein as described with reference to FIG. 4D is exposed to hydrofluoric acid to dissolve and thus remove patterned mask layer 103 therefrom (FIG. 4E).

SiC semiconductor substrate 101 thus obtained is then annealed in Ar at 1700° C. for 30 minutes and then evaluated by SIMS. It has been found that a region covered with patterned mask layer 103a does not have Al detected therein and Al implantation with acceleration energy of 340 keV can thus be prevented. A doped region 115 has a depth of 1.1 μm, which is a depth that cannot be achieved with conventional SiO$_2$ mask. Furthermore, as evaluated by Raman scattering measurement, it has been found that the crystal structure of SiC semiconductor substrate 101 has not been damaged.

FIRST COMPARATIVE EXAMPLE

A SiC semiconductor substrate is subjected to ion implantation similarly as has been described in the fourth example except that the SiC semiconductor substrate has deposited thereon a mask layer formed only of SiO$_2$ film (average thickness: 1 μm). The SiC semiconductor substrate having dopant ions implanted therein is evaluated similarly as has been described in the fourth example, and it has been found that the mask layer formed only of SiO$_2$ film (average thickness: 1 μm) is insufficient in thickness, and a region covered with the mask layer formed only of SiO$_2$ film (average thickness: 1 μm) also has Al detected therein and Al ion implantation with acceleration energy of 340 keV is insufficiently prevented. SiC semiconductor substrate 101 has its crystal structure undamaged.

SECOND COMPARATIVE EXAMPLE

A SiC semiconductor substrate is subjected to Al ion implantation similarly as has been described in the fourth example except that the SiC semiconductor substrate has deposited thereon a mask layer formed only of SiO$_2$ film (average thickness: 3 μm). The SiC semiconductor substrate having dopant ions implanted therein is evaluated similarly as has been described in the fourth example, and it has been found that the mask layer formed of SiO$_2$ film (average thickness: 3 μm) has a crack and therein Al is detected, and the mask insufficiently prevents Al ion implantation with acceleration energy of 340 keV. The SiC semiconductor substrate 101 has its crystal structure undamaged.

Although the present invention has been described and illustrated in detail, it is clearly understood that the same is by way of illustration and example only and is not to be taken by way of limitation, the spirit and scope of the present invention being limited only by the terms of the appended claims.

INDUSTRIAL APPLICABILITY

The present invention can reduce damage to a crystal structure while facilitating region-selective, high energy ion implantation into a surface of SiC and other semiconductor substrates to allow sufficiently deep dopant implantation into the substrate. Furthermore there can also be provided a mask layer that does not crack if it is exposed to high temperature.

The invention claimed is:

1. A method of fabricating a semiconductor device by employing ion implantation to provide a SiC semiconductor substrate at a surface thereof with a region having dopant introduced therein, comprising the steps of: providing said semiconductor substrate at least at a first region of a surface thereof with a mask layer including a polyimide resin film; and implanting dopant ions to an implantation depth into said semiconductor substrate at a second region of said surface of said semiconductor substrate free of said polyimide resin film; wherein said polyimide resin film has a thickness of at least twice said implantation depth.

2. The method of claim 1, wherein said semiconductor substrate is heated to at least 300° C., and said dopant ions are implanted.

3. The method of claim 1, wherein said semiconductor substrate is heated to at least 500° C. and said dopant ions are implanted.

4. The method of claim 1, wherein said polyimide resin film is formed of photosensitive polyimide resin.

5. The method of claim 1, wherein a thin metal film is further interposed between said polyimide resin film and said semiconductor substrate.

6. The method of claim 1, wherein a thin film formed of SiO$_2$ is further interposed between said polyimide resin film and said semiconductor substrate.

7. The method of claim 1, wherein said mask layer is deposited on said semiconductor substrate at said first region to be undoped with said dopant ions.

8. The method of claim 1, wherein said a dopant ions are implanted into said second region which is not masked by said mask layer.

9. A method of preparing a doped semiconductor substrate, comprising the steps:

a) providing a semiconductor substrate comprising SiC;

b) providing a mask layer including a polyimide resin film that consists of a photosensitive polyimide resin on a first region of a surface of said substrate, by applying said polyimide resin film on said first region and a second region of said surface, then exposing said polyimide resin film to light at said first region, and then removing said polyimide resin film at said second region, wherein said step b) does not involve photolithography employing a photoresist;

c) heating said substrate to at least 300° C.; and d) while said substrate is at least 300° C., implanting, by ion implantation, dopant ions into said substrate through said second region of said surface to form in said substrate a doped region that is doped with said dopant ions;

wherein said method does not involve chemical vapor deposition and does not involve dry etching.

10. The method according to claim 9, further comprising, after said step d), a step of removing said polyimide resin film by wet etching using hydrofluoric acid.

11. A method of preparing a doped semiconductor substrate, comprising the steps:

a) providing a semiconductor substrate comprising SiC;

b) providing a mask layer including a polyimide resin film on a first region of a surface of said substrate;

c) heating said substrate to at least 300° C.; and d) while said substrate is at least 300° C., implanting, by ion implantation, dopant ions into said substrate through a second region of said surface to form in said substrate a doped region that is doped with said dopant ions;

wherein said polyimide resin film has a thickness of at least twice a depth of said doped region.

12. The method according to claim 11, wherein said step b) further comprises forming said mask layer to include a metal film interposed between said polyimide resin film and said substrate.

13. The method according to claim 11, wherein said step b) further comprises forming said mask layer to include a $SiO_2$ film interposed between said polyimide resin film and said substrate.

14. The method according to claim 9, wherein said step b) further comprises forming said mask layer to include a metal film interposed between said polyimide resin film and said substrate.

15. The method according to claim 9, wherein said step b) further comprises forming said mask layer to include a $SiO_2$ film interposed between said polyimide resin film and said substrate.

* * * * *

UNITED STATES PATENT AND TRADEMARK OFFICE
CERTIFICATE OF CORRECTION

PATENT NO. : 7,364,978 B2
APPLICATION NO. : 10/528440
DATED : April 29, 2008
INVENTOR(S) : Fujikawa et al.

It is certified that error appears in the above-identified patent and that said Letters Patent is hereby corrected as shown below:

Title page,
Item [56], References Cited, U.S. PATENT DOCUMENTS,
add: --6,885,389  4/2005  Inoue et al. .......... 346/45
    7,026,650  4/2006  Ryu et al. ........... 257/77
    7,195,996  3/2007  Arai et al. ........... 438/570--;

Column 12,
Line 14, after "300° C.", delete --,--;
Line 30, after "said", delete --a--.

Signed and Sealed this

Seventh Day of July, 2009

JOHN DOLL
*Acting Director of the United States Patent and Trademark Office*